United States Patent
Blom (10) Patent No.: US 11,056,638 B2
(45) Date of Patent: Jul. 6, 2021

(54) METHOD OF MANUFACTURING AN INKJET PRINT HEAD AND AN INKJET PRINT HEAD WITH INDUCED CRYSTAL PHASE CHANGE ACTUATION

(71) Applicant: Océ Holding B.V., Venlo (NL)

(72) Inventor: Franciscus R. Blom, Venlo (NL)

(73) Assignee: CANON PRODUCTION PRINTING HOLDING B.V., Venlo (NL)

( * ) Notice: Subject to any disclaimer, the term of this patent is extended or adjusted under 35 U.S.C. 154(b) by 66 days.

(21) Appl. No.: 16/704,471

(22) Filed: Dec. 5, 2019

(65) Prior Publication Data
US 2020/0111947 A1    Apr. 9, 2020

Related U.S. Application Data

(63) Continuation of application No. PCT/EP2018/065228, filed on Jun. 8, 2018.

(30) Foreign Application Priority Data

Jun. 22, 2017 (EP) .................................. 17177308

(51) Int. Cl.
*B41J 2/14* (2006.01)
*H01L 41/083* (2006.01)
(Continued)

(52) U.S. Cl.
CPC ...... *H01L 41/0838* (2013.01); *B41J 2/14233* (2013.01); *B41J 2/161* (2013.01);
(Continued)

(58) Field of Classification Search
CPC ............... H01L 41/0838; H01L 41/081; H01L 41/0973; H01L 41/1876; H01L 41/25; H01L 41/253; B41J 2/14233; B41J 2/161
See application file for complete search history.

(56) References Cited

U.S. PATENT DOCUMENTS

| 7,845,767 B2 | 12/2010 | Sakashita et al. |
| 2008/0297005 A1* | 12/2008 | Sakashita ............... H01L 41/18 310/330 |
| 2010/0253750 A1* | 10/2010 | Sumi ................... H01L 41/1871 347/71 |

FOREIGN PATENT DOCUMENTS

| EP | 1 901 361 A2 | 3/2008 |
| EP | 2 833 423 A1 | 2/2015 |
| (Continued) |

OTHER PUBLICATIONS

International Search Report (PCT/ISA/210), issued in PCT/EP2018/065228, dated Aug. 20, 2018.
(Continued)

*Primary Examiner* — Scott A Richmond
(74) *Attorney, Agent, or Firm* — Birch, Stewart, Kolasch & Birch, LLP (57) ABSTRACT

A method for manufacturing an inkjet print head includes determining a misfit strain-electric field crystal phase relation for at least one composition of a piezoelectric material; selecting a misfit strain value and a composition of the piezoelectric material based on the determined misfit strain-electric field crystal phase relation for said at least one composition; and based on the selected misfit strain and the selected composition of the piezoelectric material, forming a base layer and an actuator stack on the base layer, the actuator stack including the piezoelectric material, wherein the base layer and the actuator stack have predetermined properties providing the selected misfit strain value and the selected composition. Thus, an inkjet print head having a piezoelectric actuator that is operated on the basis of a crystal phase change is reliably manufacturable.

13 Claims, 4 Drawing Sheets

(51) Int. Cl.
    *B41J 2/16*    (2006.01)
    *H01L 41/08*   (2006.01)
    *H01L 41/09*   (2006.01)
    *H01L 41/187*  (2006.01)
    *H01L 41/25*   (2013.01)

(52) U.S. Cl.
    CPC ........ *H01L 41/081* (2013.01); *H01L 41/0973* (2013.01); *H01L 41/1876* (2013.01); *H01L 41/25* (2013.01)

(56) References Cited

FOREIGN PATENT DOCUMENTS

| EP | 3 075 536 A1 | 10/2016 |
|---|---|---|
| JP | 2000-326506 A | 11/2000 |

OTHER PUBLICATIONS

Written Opinion of the International Searching Authority (PCT/ISA/237), issued in PCT/EP2018/065228, dated Aug. 20, 2018.

\* cited by examiner

METHOD OF MANUFACTURING AN INKJET PRINT HEAD AND AN INKJET PRINT HEAD WITH INDUCED CRYSTAL PHASE CHANGE ACTUATION

CROSS-REFERENCE TO RELATED APPLICATIONS

This application is a Continuation of International Application No. PCT/EP2018/065228, filed on Jun. 8, 2018, and for which priority is claimed under 35 U.S.C. § 120, and which claims priority under 35 U.S.C. § 119 to Application No. 17177308.8, filed in Europe on Jun. 22, 2017. The entirety of each of the above-identified applications is expressly incorporated herein by reference.

BACKGROUND OF THE INVENTION

1. Field of the Invention

The present invention generally pertains to an inkjet print head having a piezoelectric crystal actuator, wherein an actuation is induced by inducing a crystal phase change by application of an electric field. Further and in particular, the present invention pertains to a method for manufacturing such an inkjet print head.

2. Description of Related Art

An inkjet print head having a piezoelectric crystal actuator, wherein an actuation is induced by inducing a crystal phase change by application of an electric field is known, for example from U.S. Pat. No. 7,845,767, in which a method of operating such an inkjet print head is described in terms of general parameters like a minimum electric field, a maximum electric field and an electric field at which a phase change occurs. Further, general piezoelectric crystal compositions are mentioned for use in such inkjet print heads.

On the other hand, piezoelectric crystal materials are well-known for their use in inkjet print heads based on their piezoelectric effect without crystal phase change. U.S. Pat. No. 7,845,767 is however silent on any difference in composition or any other parameter to distinguish the crystal phase changing piezoelectric actuators from the well-known piezoelectric actuators, in which a crystal unit-cell changes its shape in response to an applied electric field.

The phenomenon of crystal phase change induced by a change of an electric field applied over a piezoelectric material is known as such. Similarly, it is known that the crystal phase is dependent on the temperature. For both dependencies, it is known to provide a diagram showing the crystal phase dependent on, e.g. two properties. For example, it is well-known to provide a phase diagram having a horizontal axis representing a composition property and a vertical axis representing a temperature. From the phase diagram, it may be derived which crystal phase the piezoelectric crystal has for a certain combination of composition and temperature. A similar phase diagram may be derived for a combination of composition and electric field, for example. Using such phase diagrams, it may be possible to select a composition and a suitable electric field close to a boundary between a first crystal phase and a second crystal phase. A particular one of such boundaries is commonly known as a morphotropic phase boundary. At the morphotropic phase boundary, it is possible to switch from the first crystal phase to the second crystal phase by application of an electric field.

For a practical and commercially feasible application in an inkjet print head, it is needed that a piezoelectric actuator may be mass manufactured taking into account any inevitably resulting manufacturing tolerances. Moreover, for application, it needs to be ensured that the piezoelectric material is indeed close to the morphotropic boundary to ensure that the actuator will operate properly.

It is thus an object of the present invention to provide for an inkjet print head having a piezoelectric crystal actuator, wherein an actuation is induced by inducing a crystal phase change, wherein a mode of operation of the actuator is predictable and designable. Particularly, it is an object to provide for a method for manufacturing such an inkjet print head.

SUMMARY OF THE INVENTION

In a first aspect of the present invention, a method for manufacturing an inkjet print head is provided. The method comprises the steps of determining a misfit strain-electric field crystal phase relation for at least one composition of a piezoelectric material and selecting a misfit strain value and a composition of the piezoelectric material based on such determined misfit strain-electric field crystal phase relation for said composition such that with a predetermined change in electric field a crystal phase change in the piezoelectric material is induced. Based on the selected misfit strain and the composition of the piezoelectric material, a base layer is formed and an actuator stack is formed on the base layer, wherein the actuator stack comprises the piezoelectric material. The base layer and the actuator stack have predetermined properties providing the selected misfit strain and composition.

The inventor of the present invention has found that a misfit strain between the piezoelectric layer and other layers of the actuator, in particular the base layer, is highly relevant for a crystal phase of the crystal material. The misfit strain is a strain induced by a misfit between the piezoelectric layer and the other layers. Such a misfit is commonly present in a thin film piezoelectric actuator, since the piezoelectric layer thereof is usually formed at an elevated temperature, e.g. above 600° C., and is then cooled back to room temperature, for example. Since a coefficient of thermal expansion of both materials is usually different, a strain will occur in both materials. It is noted that, for the present invention, it is not required that the strain is a result of such cooling.

Figure 1A:
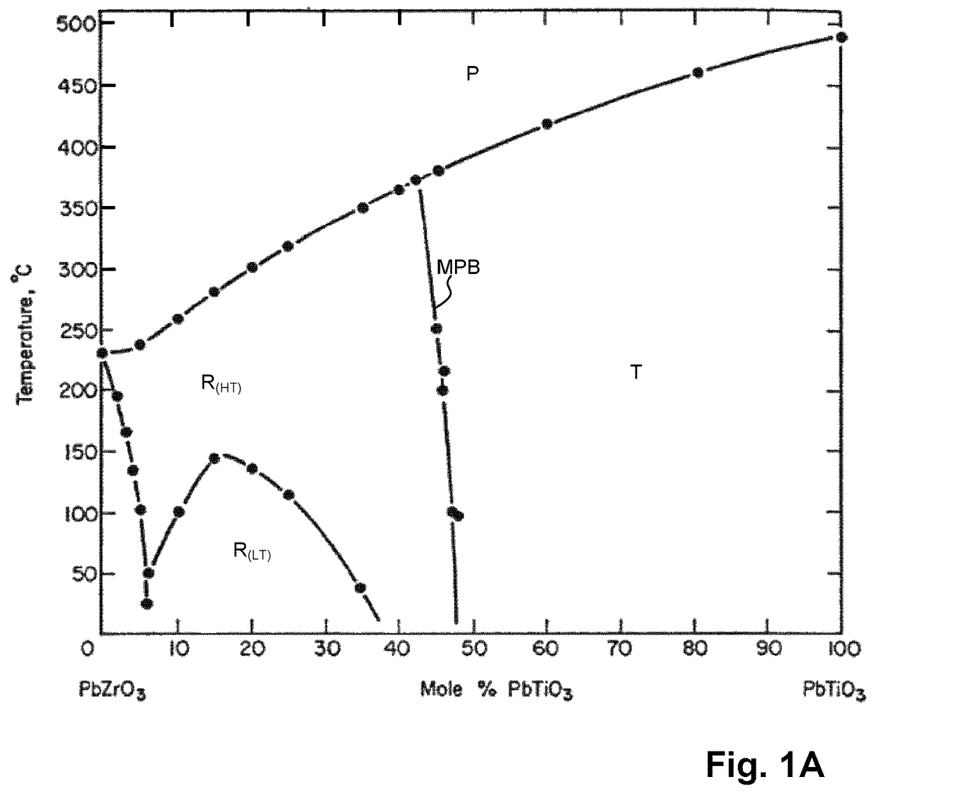
FIGS. 1A-1B are phase diagrams of unclamped PZT.
Figure 1B:
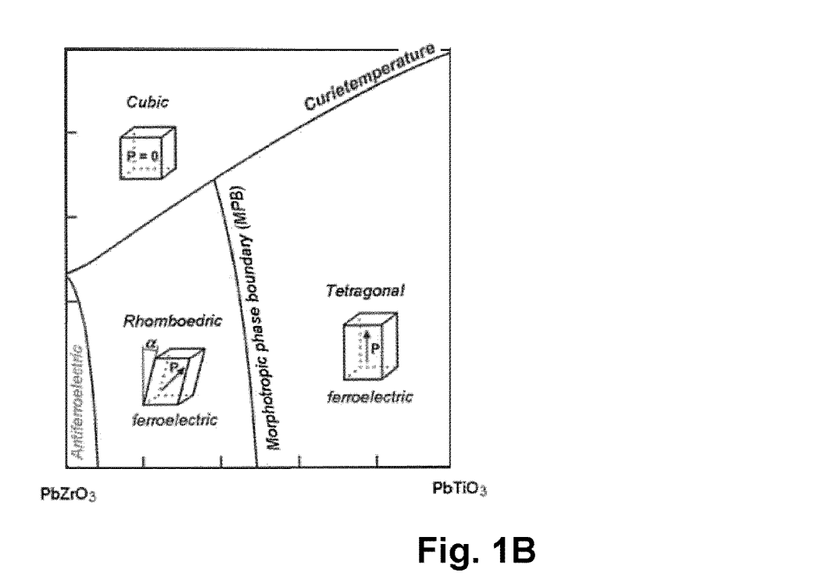

As above mentioned, the crystal phase of a piezoelectric material is known to be dependent on multiple parameters, which dependency may be represented in a phase diagram. A well-known set of parameters for use in such a phase diagram are the composition of a PZT material, e.g. a ratio of Zirconium (Zr) and Titanium (Ti), and a temperature. In FIG. 1 such a phase diagram is shown. The diagram is described hereinbelow in more detail. Based on such well-known diagrams, it is known to operate a piezoelectric actuator using a heating element (as disclosed in JP 2000326506, for example). Heating the piezoelectric crystal material will affect the crystal phase of the material, resulting in a significant change of the shape of the crystal material.

A similar phase diagram may be generated based on the misfit strain and an electric field applied on the piezoelectric material. Using such a phase diagram, it is enabled to select a specific misfit strain such that with a predetermined change in electric field a crystal phase change will be induced. Application of this phase diagram and providing a predetermined misfit strain at an operating temperature of the inkjet print head provides a reliable and controllable inkjet print head. The phase diagram further indicates the change in electric field (or the minimum value therefor) required to achieve the phase change.

Having identified the misfit strain dependency, it is enabled to control the manufacturing of the actuator of the inkjet print head such that a reliable manufacturing method is obtainable. It is noted that the misfit strain-electric field dependency may be determined for a single composition of the piezoelectric material, but may preferably be determined for multiple compositions of the piezoelectric material such that a suitable combination of composition and misfit strain may be selected.

In an embodiment of the method according to the present invention, the step of selecting comprises selecting from the misfit strain-electric field crystal phase relation a misfit strain value and a related electric field value close to a morphotropic phase boundary. The misfit strain-electric field crystal phase relation may be represented in a phase diagram, but may be presented in any other form as well, of course.

In an embodiment of the method according to the present invention, the step of selecting a misfit strain value and a composition of the piezoelectric material comprises selecting the properties of the base layer and the properties and composition of the piezoelectric material such that the piezoelectric material has a first crystal phase at a first electric field applied over the piezoelectric layer and has a second crystal phase, different from the first crystal phase, when a second electric field different from the first electric field is applied over the piezoelectric layer.

In an embodiment of the method according to the present invention, the method further comprises the step of selecting a base material for forming the base layer, wherein the base material has a base material coefficient of thermal expansion and the piezoelectric material has an piezoelectric material coefficient of thermal expansion different from the base material coefficient of thermal expansion; and wherein a step of forming the actuator stack on the base layer comprises forming the actuator stack at a manufacturing temperature, wherein the manufacturing temperature is different from an operating temperature, the operating temperature being a temperature at which the inkjet print head is operated for expelling droplets of a liquid, wherein properties of the base material are selected such that at the operating temperature the misfit strain between the base layer and actuator stack corresponds to the selected misfit strain value. It is contemplated that the manufacturing temperature may be selected and controlled to arrive at the desired misfit strain.

In order to arrive at the selected misfit strain, it is possible to select certain properties of the base layer, in particular its material composition, to control its base material coefficient of thermal expansion. Since the actuator stack may be formed at an elevated temperature, in particular the manufacturing temperature, and the inkjet print head is operated at a different, usually lower temperature, the misfit strain may be provided by the difference in the coefficients of thermal expansion, as above mentioned. Of course, other properties may contribute as well. For example, a thickness of the base layer may affect the misfit strain as well. Depending on the envisaged application of the inkjet print head, the properties may be base layer and the actuator stack may be selected.

In an embodiment of the method according to the present invention, the method comprises the steps of providing the base layer having the predetermined properties; forming a bottom electrode on the base layer; forming a piezoelectric layer on the base layer and the bottom electrode and forming a top electrode on the piezoelectric layer, wherein the actuator stack comprises the bottom electrode, the piezoelectric layer and the top electrode. It is noted that the bottom and top electrode may contribute in the resulting misfit strain. Still, usually the electrodes have such a small thickness compared to the piezoelectric layer and the base layer that the influence of the electrodes on the misfit strain may be insignificant. In any case, controlling the misfit strain by controlling the bottom and top electrodes may prove difficult due to their small contribution to the misfit strain.

In a second aspect, the present invention provides an inkjet print head having at least one ejection unit for ejection a droplet of a liquid. The ejection unit of the inkjet print head according to the present invention comprises a pressure chamber for holding an amount of the liquid; an actuator forming a flexible wall of the pressure chamber and arranged for changing a volume of the pressure chamber upon receipt of an actuation signal; and a nozzle orifice in liquid communication with the pressure chamber for expelling the droplet of the liquid upon a suitable change of the volume of the pressure chamber. The actuator of the inkjet print head comprises a base layer arranged over the pressure chamber and an actuator stack arranged on the base layer. The actuator stack comprises a piezoelectric material having a predetermined misfit strain at an operating temperature, the operating temperature being a temperature at which the inkjet print head is operated for expelling droplets of a liquid, such that the piezoelectric material has a predetermined first crystal phase and, upon application of the actuation signal, has a second crystal phase, different from the first crystal phase, wherein the predetermined misfit strain is selected based on a misfit strain-electric field crystal phase relation for at least one composition of the piezoelectric material such that with a predetermined change in electric field a crystal phase change in the piezoelectric material is induced.

In an embodiment of the inkjet print head according to the present invention, the material of the base layer has a base material coefficient of thermal expansion and the piezoelectric material has a piezoelectric material coefficient of thermal expansion, wherein the piezoelectric material coefficient of thermal expansion is different from the base material coefficient of thermal expansion. The actuator stack and the base layer are manufactured at a manufacturing temperature different from the operating temperature and the predetermined misfit strain results from a change in temperature from the manufacturing temperature to the operating temperature.

In an embodiment of the inkjet print head according to the present invention, the base layer comprises silicon. Inkjet print heads having a high nozzle density for achieving a high print resolution may be manufactured by application of MEMS technology, which applies photo-lithographic techniques and etching for providing micro-electro mechanical structures. Silicon is a well-known and very suitable material for such manufacturing process.

In an embodiment of the inkjet print head according to the present invention, the piezoelectric material is a ferroelectric material and is in particular a perovskite piezoelectric material. Where suitable, a lead-free piezoelectric material may be preferred.

In an embodiment, the predetermined misfit strain is selected based on a misfit strain-electric field crystal phase relation for at least one composition of the piezoelectric material wherein a misfit strain value and a related electric field value are selected close to a morphotropic phase boundary. Selecting said values near the morphotropic phase boundary allows the phase change in the piezoelectric material to be achieved with relative low electric fields. Power consumption of the inkjet print head is thereby reduced.

In an embodiment, the predetermined misfit strain is selected based on a misfit strain-electric field crystal phase relation for at least one composition of the piezoelectric material wherein a misfit strain value is selected to lie on one side of a morphotropic phase boundary defining the first crystal phase and the actuation signal is selected to bring the at least one composition of the piezoelectric material to an opposite side of the morphotropic phase boundary into the second crystal phase. Preferably, during operation, the applied actuation signal is configured to achieve the phase change in the piezoelectric material by bringing it across the morphotropic phase boundary. The actuation signal thus comprises a sufficiently large electric field value to move the piezoelectric material between the first and second crystal phases. A phase diagram plotting the misfit strain vs electric field and showing the different crystal phases may be used to determine a suitable electric field value, which is e.g. at least the value between the first crystal phase and the adjacent morphotropic phase boundary as measured along an axis for electric field value.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will now be described with reference to the accompanying drawings, wherein the same reference numerals have been used to identify the same or similar elements throughout the several views.

FIGS. 1A and 1B are phase diagrams of PZT, which is a piezoelectric material, in particular a ferroelectric material and more in particular a perovskite material. In the illustrated phase diagram, the horizontal axis represents a composition of the PZT material. The PZT material comprises Lead (Pb), Oxygen (O), Zirconium (Zr) and Titanium (Ti). The PZT material has a crystal structure comprising unit cells, wherein each unit cell comprises Lead, Oxygen and either Zirconium ($PbZrO_3$) or Titanium ($PbTiO_3$). Certain properties of the PZT material depend on the ratio of the number of unit cells comprising Zirconium and the number of unit cells comprising Titanium. The horizontal axis of the phase diagram presented in FIGS. 1A and 1B represents the percentage of unit cells comprising Titanium, meaning that at the origin of the diagram (0 at the horizontal axis), the PZT material only contains unit cells with Zirconium ($PbZrO_3$) and at 100 on the horizontal axis, the PZT material contains only unit cells with Titanium ($PbTiO_3$). The vertical axis represents a temperature of the PZT material in degrees Celsius.

Depending on the composition of the PZT material and its temperature, the unit cells have a certain shape, which is commonly known as a crystal phase of the crystal material. Three main crystal phases are known for PZT: a cubic phase P, a rhomboedric phase R and a tetragonal phase T. The latter two crystal phases are known to have ferroelectric properties. A boundary between these two ferroelectric phases, i.e. the rhomboedric phase R and the tetragonal phase T, is known as the morphotropic phase boundary MPB. Above its Curie temperature, the PZT material is in a cubic phase having no polarization (FIG. 1B: P=0) contrary to other crystal phases.

It is noted that the phase diagram shown in FIGS. 1A and 1B corresponds to unclamped, i.e. unstrained PZT material. When used in an inkjet print head, the PZT material is attached to a flexible material, limiting the expansion and contraction of the PZT material at least on one of its sides. So, although this phase diagram is useful to understand the dependency of the behavior of PZT material on temperature, this phase diagram does not describe the behavior of PZT material arranged in an inkjet print head.

Further, similar phase diagrams may be determined for other aspects and properties. For example, in view of the shape change of PZT material under influence of an applied electric field, a phase diagram may be determined for a combination of composition (Zr—Ti ratio) and an applied electric field (instead of temperature). Performing suitable experiments, a skilled person is readily enabled to determine such a phase diagram.

Figure 2A:
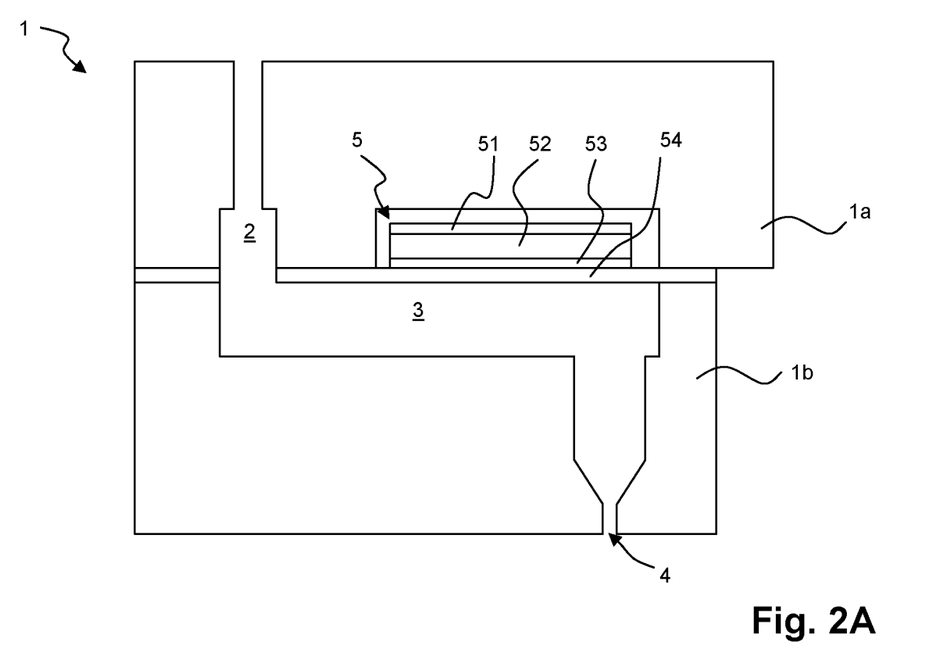
FIGS. 2A-2B are cross-sections of an embodiment of a MEMS-based inkjet print head according to the present invention.
Figure 2B:
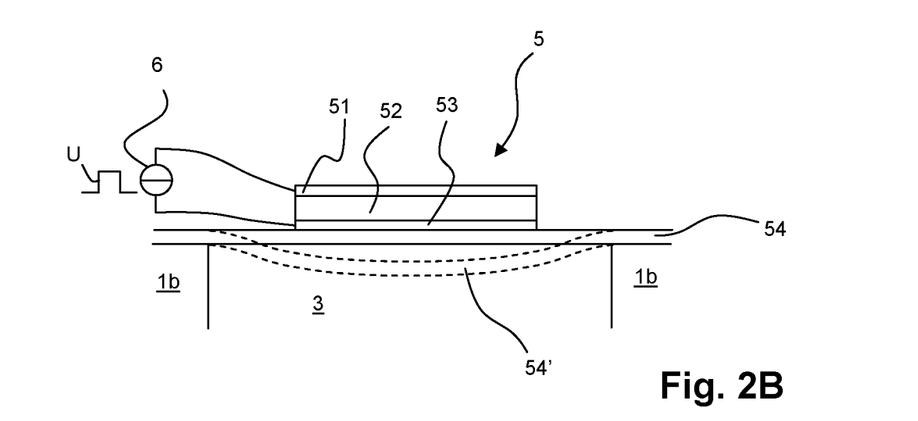

FIGS. 2A and 2B illustrate a MEMS inkjet print head 1 comprising a first base structure element 1a and a second base structure element 1b. These base structure elements 1a and 1b may be formed of silicon wafers by lithographic techniques and etching to form a micro-electromechanical system (MEMS).

The inkjet print head 1 comprises a liquid flow path, which comprises a liquid inlet port 2, a pressure chamber 3 and a nozzle orifice 4. Further, an actuator 5 is in operative coupling with the pressure chamber 3. The actuator 5 comprises a base layer 54 forming a flexible wall of the pressure chamber 3. On the base layer 54, an actuator stack comprising a bottom electrode 53, a piezoelectric layer 52 and a top electrode 51, is arranged. A signal generator 6 may be electrically connected to the bottom electrode 53 and the top electrode 51 to supply an actuation signal U. Due to the actuation signal U generating a voltage between the top electrode 51 and the bottom electrode 53. An electric field is generated in which the piezoelectric layer 52 is arranged. The generated electric field induces a shape change in the piezoelectric layer 52 as well known in the art. As the bottom electrode 53 of the actuator stack is attached to the base layer 54, the piezoelectric layer 52 is limited in changing its shape, resulting in bending of the actuator 5 as illustrated by a dashed base layer 54' (FIG. 2B; for clarity only the base layer 54 is shown in a bent state, while in practice also the actuator stack 51, 52, 53 bends with the base layer 54).

As well known in the art, bending of the actuator 5 results in a volume change of the pressure chamber 3. A pressure in a liquid (e.g. ink) in the pressure chamber 3 changes and a pressure wave eventually may result in a droplet of the liquid being expelled through the nozzle orifice 4.

For a number of technical considerations such as minimizing energy consumption and increasing a lifetime of the actuator 5, it is desired to achieve an as large as possible volume change in the pressure chamber 3 with an as low as possible actuation voltage. In other words, it is desired to have a piezoelectric layer 52 having a large change in shape in response to an only low voltage over the bottom and top electrodes 53, 51. Such a relatively large change is possible with a change in crystal phase.

In this respect, it is noted that PZT has been widely and extensively used in inkjet print heads for its relatively large piezoelectric effect, i.e. change of size of the unit cells under the influence of an applied electric field. The above-suggested change of the crystal phase is another phenomenon. Considering that PZT contains Lead (Pb), which may be considered as a less preferred material in view of health and environmental aspects, it is contemplated that other piezoelectric materials, in particular ferroelectric materials and more in particular perovskite materials having a smaller piezoelectric effect may be used and be very suitable as an actuator based on its change in crystal phase. For example, Barium Titanate ($BaTiO_3$), Sodium/Potassium Niobate (($Na,K)NbO_3$) or other perovskites ($[AB]O_3$) may be suitable. In general, any crystal material changing its crystal phase in response to an applied electric field may potentially be suitable to be used in the present invention. Hereinafter, the present invention will be elucidated with reference to PZT material without limiting the present invention in any respect.

The actuator 5 is usually manufactured by supplying the base layer 54 and providing thereon the bottom electrode 53, the piezoelectric layer 52 and the top electrode 51. For providing the piezoelectric layer 52, usually, an elevated temperature is needed to anneal the piezoelectric material, which is commonly performed at a temperature of about 600° C. or higher, which is herein referred to as a manufacturing temperature. At such elevated manufacturing temperature, all materials have expanded compared to a state at room temperature, for example. The amount of expansion is determined by the respective coefficients of thermal expansion, which differs per material. So, depending on the coefficient of thermal expansion of the base layer 54 and the coefficient of thermal expansion of the piezoelectric layer 52 and the electrodes 51, 53, and depending on other aspects such as thickness, and the like, after cooling to a lower temperature such as room temperature, a misfit strain is generated in the actuator 5, and in particular in the piezoelectric layer 52. This strain affects the crystal structure and, depending on other aspects, potentially also the crystal phase as will be explained in more detail hereinafter with reference to FIGS. 3A-5B.

The actually resulting misfit strain may be used to design and provide for an actuator 5 that affects the pressure chamber volume by a change in crystal phase. The actually resulting misfit strain may, for example, be adapted to a desired value by changing the annealing temperature resulting in a larger temperature difference with room temperature or an operating temperature (a temperature at which the inkjet print head is operated for expelling droplets. It is known to operate inkjet print heads in a range from about room temperature for expelling droplets of an aqueous ink to a temperature of about 140° C. for expelling droplets of a hot-melt ink). The misfit strain may also be controlled by selecting suitable materials taking into account their respective coefficients of thermal expansion, selecting the shape (e.g. thickness) of the base layer 54, electrodes 51, 53 and/or the piezoelectric layer 52, or by providing additional layers. For example, an additional layer composed of an elastic material may be provided between the base layer 54 and either the bottom electrode 53 or the piezoelectric layer 52 to reduce the misfit strain. Any other means, elements or features are contemplated within the scope of the present invention to design and manufacture a suitable misfit strain in the actuator 5. In this respect, it is also noted that the thermal misfit strain described herein is a main contributor to the resulting misfit strain, but other aspects, e.g. different unit cell sizes of base layer 54 and piezoelectric layer 52, have a contribution as well. Such aspects are known in the art and, therefore, such aspects are not described in detail herein. Still, also such other aspects may be used to design the actuator to arrive at a desired resulting misfit strain.

Figure 3A:
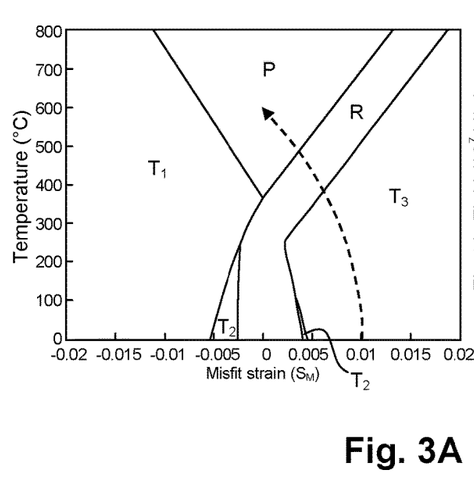
FIGS. 3A-3B are phase diagrams of a first PZT composition in a clamped state.
Figure 3B:
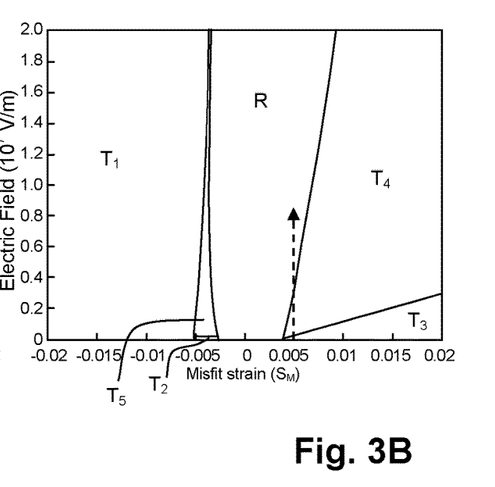

In FIGS. 3A and 3B, a phase diagram for a first PZT composition, in a clamped state, is shown. The first PZT composition comprises about 60% $PbZrO_3$ and about 40% $PbTiO_3$. The phase diagram of FIG. 3A illustrates the dependency of the crystal phase on the misfit strain ($S_M$, horizontal axis) and temperature (° C., vertical axis).

The misfit strain on the horizontal axis runs from a negative value to a positive value. For a negative misfit strain $S_M$, the base layer 54 has a larger coefficient of thermal expansion. Thus, when not attached to each other, the base layer 54 would contract more than the PZT layer 52 upon cooling. For a positive value of the misfit strain, the coefficient of thermal expansion is larger for the piezoelectric PZT material and, similarly, the PZT layer 52 would contract more than the base layer 54 upon cooling. For an identical coefficient of thermal expansion, the misfit strain would be equal to zero and the piezoelectric layer 52 would behave in correspondence to the phase diagram of FIGS. 1A and 1B with the composition of 40% $PbTiO_3$ (horizontal axis).

In FIGS. 3A-5B, the tetragonal phase has been divided in five secondary tetragonal phases $T_1$, $T_2$, $T_3$, $T_4$ and $T_5$. These secondary phases may impact the size and shape of the piezoelectric layer. However, the effect of these changes in secondary tetragonal phase does not contribute more than the usual piezoelectric effect. Therefore, any change in the secondary tetragonal phase is ignored herein and is not considered a crystal phase change within the meaning of the present invention. Hereinafter, each of the five secondary tetragonal phases may simply be referred to as a tetragonal phase.

In FIG. 3A, it is shown that with a small misfit strain (about $-0.003 < S_M < 0.003$) and a temperature in a range of 0° C. to about 350° C., the PZT material is in a rhombohedral phase R. Increasing the temperature will result in a change into the cubic phase P. The temperature at which the change occurs depends on the actual misfit strain. The larger the misfit strain, the higher the temperature needs to be to change to the cubic phase P. With larger misfit strain and/or lower temperature, the PZT material will be in one of the tetragonal phases $T_1$, $T_2$ or $T_3$.

At room temperature, the actual misfit strain determines in which crystal phase the PZT material will be. As mentioned above, with a small misfit strain, the PZT material is in the rhombohedral phase R and with a larger misfit strain (i.e. smaller than about −0.003 or larger than about 0.003), the PZT material has a tetragonal phase $T_1$, $T_2$ or $T_3$.

A dashed arrow is shown to elucidate how the PZT material would behave, if the misfit strain at 0° C. would be about 0.01 and the temperature would be increased to about 600° C., presuming that the PZT material has been manufactured at a manufacturing temperature of about 600° C. Starting from the misfit strain 0.01, the misfit strain would decrease with an increasing temperature. At 600° C. the misfit strain would be zero again, identical to the state in which the actuator was during manufacturing at the manufacturing temperature. Although the dashed arrow has been shown in a curved line, the actual trajectory may deviate therefrom and it is thus noted that the dashed arrow is merely for illustrative purposes. Along the trajectory of the dashed arrow with the increasing temperature, the PZT material undergoes two crystal phase changes. The PZT material starts with having a tetragonal phase $T_3$. At a temperature of about 400° C. the crystal phase changes into the rhombohedral phase R and at a temperature of about 500° C. changes into the cubic phase P.

Note that the present invention is very suitable to provide for a piezoelectric actuator to be used at a relatively high temperature. While the PZT material loses its piezoelectric effect in the cubic phase P, providing a suitable misfit strain may enable the PZT material to be used at a high temperature. For example, with a misfit strain of about −0.015 at a temperature of about 600° C., the PZT material is in a tetragonal phase $T_1$ and may thus be used as an actuator by employing its piezoelectric effect. In another example, providing a misfit strain of about 0.015 at a temperature of about 600° C. may employ the PZT material close to the morphotropic boundary (boundary between $T_3$ and R), although this phase diagram of FIG. 3A does not reveal how such a PZT material at such temperature would behave in response to an electric field. In any case, the PZT material could at least be used as an actuator by application of heat such that the crystal phase would change in response to an increase in temperature.

FIG. 3B does reveal how the PZT composition of FIG. 3A behaves at room temperature in response to an applied electric field and dependent on the misfit strain. Hence, the crystal phases as shown along the horizontal line of about 25° C. (room temperature) in FIG. 3A correspond to the crystal phases along the horizontal line of an electric field of 0 V/m in FIG. 3B.

In FIG. 3B, at room temperature, the cubic phase P is not present. In general, it may be concluded that for this PZT composition, with a small misfit strain, the PZT material is in a rhombohedral phase R, while with a larger misfit strain the PZT material is in a tetragonal phase $T_1$, $T_2$, $T_3$, $T_4$ or $T_5$. Still, at certain constant misfit strains, a morphotropic phase boundary may be crossed. For example, with a misfit strain of about 0.005 and increasing electric field strength (dashed arrow), the crystal phase may change from the tetragonal phase $T_4$ to the rhombohedral phase R at an electric field strength of about 0.3-10$^7$ V/m (i.e. about 3 V/μm). Considering a thin film piezoelectric actuator as commonly used in a MEMS inkjet print head, wherein the thin film actuator has a thickness of a few microns. e.g. 1-5 microns, a crystal phase change from tetragonal to rhombohedral may be effected by application of a voltage over the electrodes of only about 4-20 V, respectively, while employing only the piezoelectric effect usually requires actuation voltages about four times larger, e.g. 25 V for a piezoelectric layer having a thickness of about 2 microns. With such a reduction of required voltage, the energy consumption of the inkjet print head may be significantly reduced.

Figure 4A:
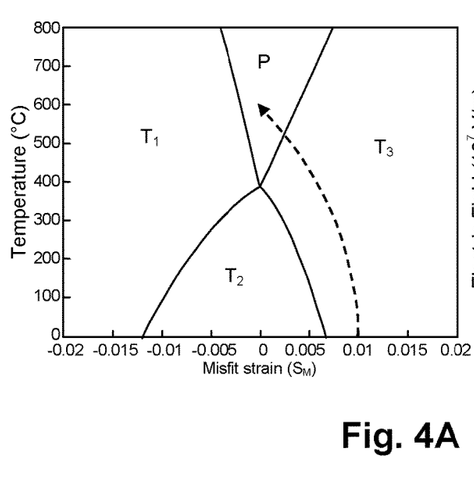
FIGS. 4A-4B are phase diagrams of a second PZT composition in a clamped state.
Figure 4B:
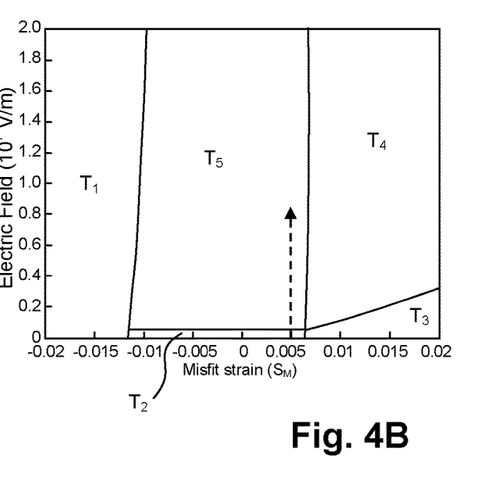

FIGS. 4A and 4B illustrate similar phase diagrams as FIGS. 3A and 3B, respectively, for a second PZT composition comprising about 50% $PbZrO_3$ and about 50% $PbTiO_3$. As is apparent from these phase diagrams, the rhombohedral phase is not available, irrespective of misfit strain, temperature and electric field. Hence, such a PZT composition would not be suitable for use with the present invention. Correspondingly, these phase diagrams of FIGS. 4A and 4B are not discussed in more detail herein.

Figure 5A:
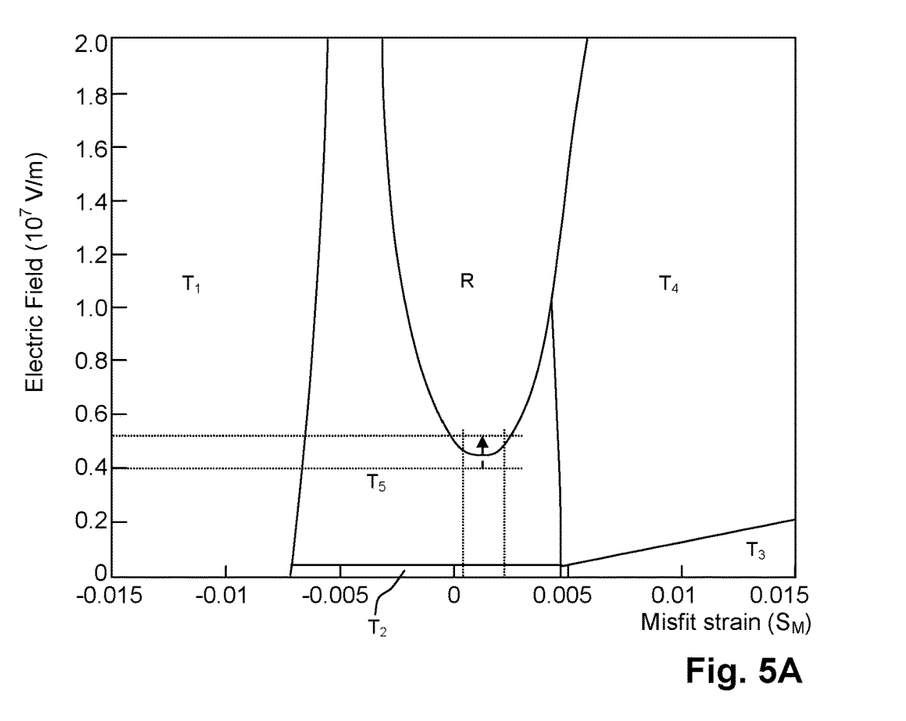
FIG. 5A is a phase diagram of a third PZT composition in a clamped state.

Turning to FIG. 5A, a phase diagram for a third PZT composition comprising about 55% $PbZrO_3$ and about 45% $PbTiO_3$ at room temperature is shown. Advantageously, over a range of misfit strain extending from a little above 0 to about 0.002 (dotted vertical lines), the morphotropic phase boundary corresponds to a constant electric field, in particular to about 4.6 V/μm. Irrespective of the actual misfit strain, provided the misfit strain is within the indicated range, the actuation by crystal phase change may be affected. Hence, a working latitude is provided such that manufacturing tolerances affecting the resulting misfit strain and/or differences in misfit strain within a batch will not affect the droplet ejection functionality.

In an embodiment, a bias voltage of about 4 V/μm may be applied and an actuation voltage of about 1.2 V/μm may be superposed on the bias voltage such that at the bias voltage the PZT material is in the tetragonal phase $T_5$ and upon application of the actuation voltage changes to the rhombohedral phase R.

Figure 5B:
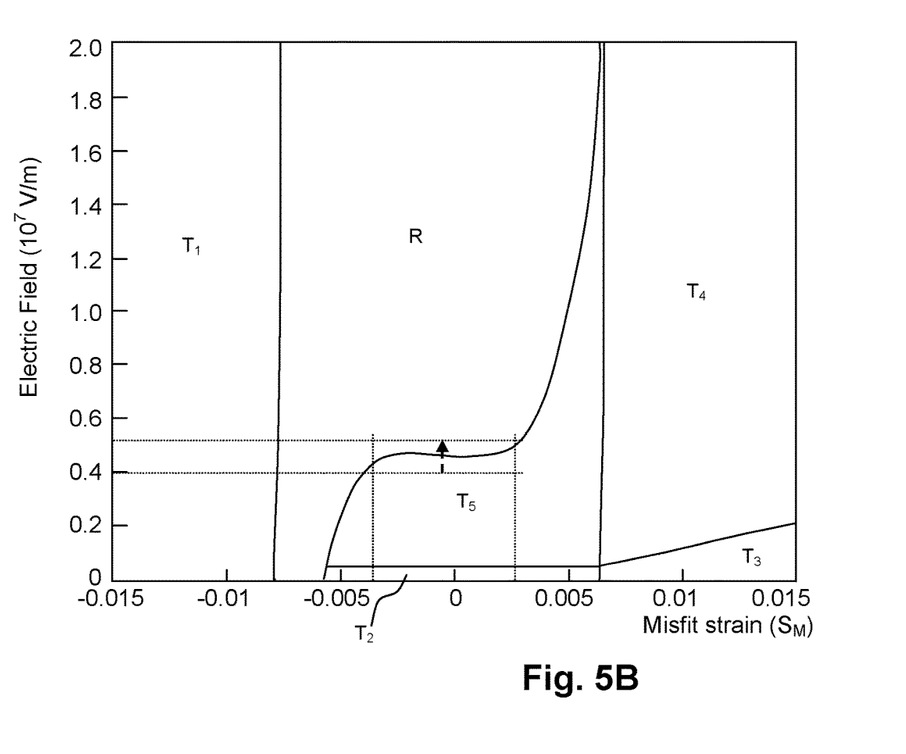
FIG. 5B is a phase diagram of a fourth PZT composition in a clamped state.

In FIG. 5B a phase diagram for a fourth PZT composition comprising about 50% $PbZrO_3$ and about 50% $PbTiO_3$ is shown. Compared to the phase diagrams of FIGS. 4A and 4B relating to a similar PZT composition, the phase diagram in FIG. 5B takes into account poly-domain effects present in certain of the secondary tetragonal phases. Due to these poly-domain effects, the phase diagram is quite different from the corresponding phase diagram of FIG. 4B. Moreover and advantageously, over a relatively large range of misfit strain (about −0.003<$S_M$<about 0.002), the morphotropic phase boundary corresponds to a constant electric field of about 4.6 V/μm. So, as above described in relation to FIG. 5A, this PZT composition may be very suitable to be used in a practical embodiment considering manufacturing tolerances affecting an actual misfit strain potentially deviating from a designed and desired misfit strain.

With respect to the phase diagrams of FIGS. 3A-5B, it is remarked that these diagrams have been generated using mathematical models which are based on physical experiments. For these experiments, the piezoelectric layer was generated using epitaxial growth based on pulsed laser deposition. Using other methods for manufacturing the piezoelectric layer, different phase diagrams may result. So, within the scope of the present invention, it is noted that for each manufacturing method and material selection, a phase diagram may need to be determined before selecting a particular composition, manufacturing settings and other aspects.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims is herewith disclosed.

Further, it is contemplated that structural elements may be generated by application of three-dimensional (3D) printing techniques. Therefore, any reference to a structural element is intended to encompass any computer executable instructions that instruct a computer to generate such a structural element by three-dimensional printing techniques or similar computer controlled manufacturing techniques. Furthermore, such a reference to a structural element encompasses a computer readable medium carrying such computer executable instructions.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing an inkjet print head, wherein the method comprises the steps of:
   determining a misfit strain-electric field crystal phase relation for at least one composition of a piezoelectric material;
   selecting a misfit strain value and a composition of the piezoelectric material based on the determined misfit strain-electric field crystal phase relation for said at least one composition such that, with a predetermined change in electric field, a crystal phase change in the piezoelectric material is induced; and
   based on the selected misfit strain value and the selected composition of the piezoelectric material, forming a base layer and an actuator stack on the base layer, the actuator stack comprising the piezoelectric material, wherein the base layer and the actuator stack have predetermined properties providing the selected misfit strain value and the selected composition of the piezoelectric material.

2. The method according to claim 1, wherein the step of selecting comprises selecting from the misfit strain-electric field crystal phase relation a misfit strain value and a related electric field value close to a morphotropic phase boundary.

3. The method according to claim 1, wherein the step of selecting a misfit strain value and a composition of the piezoelectric material comprises selecting the properties of the base layer and the properties and composition of the piezoelectric material such that the piezoelectric material has a first crystal phase at a first electric field applied over the piezoelectric layer and has a second crystal phase, different from the first crystal phase, when a second electric field different from the first electric field is applied over the piezoelectric layer.

4. The method according to claim 1, further comprising the step of selecting a base material for forming the base layer, wherein the base material has a base material coefficient of thermal expansion and the piezoelectric material has a piezoelectric material coefficient of thermal expansion different from the base material coefficient of thermal expansion,
   wherein the step of forming the actuator stack on the base layer comprises forming the actuator stack at a manufacturing temperature, wherein the manufacturing temperature is different from an operating temperature, the operating temperature being a temperature at which the inkjet print head is operated for expelling droplets of a liquid, and
   wherein properties of the base material are selected such that, at the operating temperature, the misfit strain between the base layer and the actuator stack corresponds to the selected misfit strain value.

5. The method according to claim 1, further comprising the steps of:
   providing the base layer having the predetermined properties;
   forming a bottom electrode on the base layer;
   forming a piezoelectric layer on the base layer and the bottom electrode; and
   forming a top electrode on the piezoelectric layer,
   wherein the actuator stack comprises the bottom electrode, the piezoelectric layer and the top electrode.

6. The method according to claim 1, wherein the misfit strain is a strain induced by a misfit between the piezoelectric layer and the electrode stack.

7. An inkjet print head having at least one ejection unit for ejection of a droplet of a liquid, the ejection unit comprising:
   a pressure chamber for holding an amount of the liquid;
   an actuator forming a flexible wall of the pressure chamber and arranged for changing a volume of the pressure chamber upon receipt of an actuation signal; and
   a nozzle orifice in liquid communication with the pressure chamber for expelling the droplet of the liquid upon a suitable change of the volume of the pressure chamber,
   wherein the actuator comprises:
   a base layer arranged over the pressure chamber; and
   an actuator stack arranged on the base layer,
   wherein the actuator stack comprises a piezoelectric material having a predetermined misfit strain such that, at an operating temperature, the operating temperature being a temperature at which the inkjet print head is operated for expelling droplets of a liquid, the piezoelectric material has a predetermined first crystal phase and, upon application of the actuation signal, has a second crystal phase, different from the first crystal phase,
   wherein the predetermined misfit strain is selected based on a misfit strain-electric field crystal phase relation for at least one composition of the piezoelectric material such that, with a predetermined change in electric field, a crystal phase change in the piezoelectric material is induced.

8. The inkjet print head according to the claim 7, wherein the material of the base layer has a base material coefficient of thermal expansion and the piezoelectric material has a piezoelectric material coefficient of thermal expansion, wherein the piezoelectric material coefficient of thermal expansion is different from the base material coefficient of thermal expansion, and
   wherein the actuator stack and the base layer are manufactured at a manufacturing temperature different from the operating temperature and the predetermined misfit strain results from a change in temperature from the manufacturing temperature to the operating temperature.

9. The inkjet print head according to claim 7, wherein the base layer comprises silicon.

10. The inkjet print head according to claim 7, wherein the piezoelectric material is a ferroelectric material and is in particular a perovskite piezoelectric material.

11. The inkjet print head according to claim 7, wherein the predetermined misfit strain is selected based on a misfit strain-electric field crystal phase relation for at least one composition of the piezoelectric material, and
wherein a misfit strain value and a related electric field value are selected close to a morphotropic phase boundary.

12. The inkjet print head according to claim 7, wherein the predetermined misfit strain is selected based on a misfit strain-electric field crystal phase relation for at least one composition of the piezoelectric material,
wherein a misfit strain value is selected to lie on one side of a morphotropic phase boundary defining the first crystal phase and the actuation signal is selected to bring the at least one composition of the piezoelectric material to an opposite side of the morphotropic phase boundary into the second crystal phase.

13. The inkjet print head according to the claim 7, wherein the misfit strain is a strain induced by a misfit between the piezoelectric layer and the electrode stack.

\* \* \* \* \*